(12) United States Patent
Qu et al.

(10) Patent No.: US 8,816,466 B2
(45) Date of Patent: Aug. 26, 2014

(54) PROTECTIVE ELEMENT FOR ELECTRONIC CIRCUITS

(75) Inventors: Ning Qu, Reutlingen (DE); Alfred Goerlach, Kusterdingen (DE)

(73) Assignee: Robert Bosch GmbH, Stuttgart (DE)

( * ) Notice: Subject to any disclaimer, the term of this patent is extended or adjusted under 35 U.S.C. 154(b) by 33 days.

(21) Appl. No.: 13/505,534

(22) PCT Filed: Sep. 21, 2010

(86) PCT No.: PCT/EP2010/063849
§ 371 (c)(1),
(2), (4) Date: Jul. 20, 2012

(87) PCT Pub. No.: WO2011/057841
PCT Pub. Date: May 19, 2011

(65) Prior Publication Data
US 2012/0280353 A1 Nov. 8, 2012

(30) Foreign Application Priority Data

Nov. 11, 2009 (DE) .......................... 10 2009 046 606

(51) Int. Cl.
*H01L 29/47* (2006.01)
(52) U.S. Cl.
USPC ................ 257/471; 257/603; 438/91; 438/92
(58) Field of Classification Search
USPC ................................ 257/471, 603; 438/91, 92
See application file for complete search history.

(56) References Cited

U.S. PATENT DOCUMENTS

| 5,164,615 | A | * | 11/1992 | Walters | 327/583 |
| 5,338,964 | A | * | 8/1994 | Bernier | 257/476 |
| 5,502,329 | A | | 3/1996 | Pezzani | |
| 5,525,821 | A | * | 6/1996 | Harada et al. | 257/331 |
| 5,962,893 | A | * | 10/1999 | Omura et al. | 257/329 |
| 7,737,523 | B2 | * | 6/2010 | Kikuchi et al. | 257/484 |
| 2008/0211552 | A1 | * | 9/2008 | Lu | 327/143 |

FOREIGN PATENT DOCUMENTS

| DE | 694 28 996 | 6/2002 |
| DE | 20 2005 017 287 | 2/2006 |
| DE | 10 2007 045 185 | 4/2009 |
| JP | 6-205533 | 7/1994 |
| JP | 8-107222 | 4/1996 |
| JP | 8-213619 | 8/1996 |
| JP | 8-223935 | 8/1996 |
| JP | 10-174309 | 6/1998 |
| JP | 11-154748 | 6/1999 |
| JP | 2003-124324 | 4/2003 |
| JP | 2003-124325 | 4/2003 |

* cited by examiner

*Primary Examiner* — Lex Malsawma
*Assistant Examiner* — Eric Jones
(74) *Attorney, Agent, or Firm* — Kenyon & Kenyon LLP

(57) ABSTRACT

A protective element for electronics has at least one Schottky diode and at least one Zener diode which are located between a power supply and the electronics, the anode of the Schottky diode being connected to the power supply and the cathode of the Schottky diode being connected to the electronics, and the cathode and the anode of the Zener diode are connected to ground. The Schottky diode is a trench MOS barrier junction diode or trench MOS barrier Schottky (TMBS) diode or a trench junction barrier Schottky (TJBS) diode and includes an integrated semiconductor arrangement, which has at least one trench MOS barrier Schottky diode and a p-doped substrate, which is used as the anode of the Zener diode.

14 Claims, 2 Drawing Sheets

PROTECTIVE ELEMENT FOR ELECTRONIC CIRCUITS

BACKGROUND OF THE INVENTION

1. Field of the Invention

The present invention relates to a protective element for electronic circuits.

2. Description of Related Art

Many electronic circuits and components are supplied with power from a battery or an accumulator. In many applications, it is possible that the battery or the accumulator may be connected to the electronic circuit with incorrect polarity. In this case, the positive pole of the battery is unintentionally applied to the negative terminal of the circuit and the negative pole is applied to the positive terminal. This procedure is referred to as polarity reversal. For example, the accumulator of a motor vehicle may unintentionally be connected the wrong way around in the event of maintenance or repair work. High currents may thus flow through the connected electronic circuits and damage them. A pn-diode, which is inserted between the accumulator and the electronic circuit, may be used as a corrective measure. If the battery is connected correctly, current flows through the diode into the connected electronics. In the event of a polarity reversal, the diode prevents a current flow.

The electronic circuits and components are typically additionally protected against overvoltages, which may occur during operation of a motor vehicle, for example. Thus, for example, positive and negative interfering voltages or overvoltages may occur in a motor vehicle. For example, in the event of sudden load changes or shutdowns of the motor vehicle generator, positive voltages up to approximately 90 V may be generated in a period of time up to approximately 400 ms. Therefore, an additional Zener or Z diode is frequently used for voltage limitation to protect the electronics. A typical protective system, which may also be integrated into a semiconductor, is shown in FIG. 1. Such a protective element contains a polarity reversal protection diode D and a Z diode Z for the overvoltage protection. It is connected between the power supply, i.e., battery B or accumulator, and electronics E. Terminal A1 is connected to battery B or the voltage supply and terminal A2 is connected to electronics E. A3 is connected to ground. The voltage drop of approximately 0.8 V-1 V, which drops via polarity reversal protection diode D depending on the current intensity, is disadvantageous. In addition to the power loss occurring in this case, the voltage supplied by the battery is also reduced by this amount.

BRIEF SUMMARY OF THE INVENTION

The device according to the present invention and the method according to the present invention have the advantage that the above-mentioned disadvantages no longer occur. To avoid or decrease the occurring power loss or the voltage, a system is used in which diode D is replaced by a Schottky diode S. Due to the lower forward voltage of a Schottky diode, the voltage drop via the protective element is less. However, relatively high leakage or reverse currents occur in Schottky diodes, which restrict their use at elevated temperatures. Since the forward voltages of a Schottky diode are generally lower than in pn-diodes, their reverse currents are also higher. In addition, the reverse current of a simple Schottky diode increases with increasing reverse voltage.

Therefore, a particularly advantageous embodiment of the present invention is possible, in which Schottky diodes are used, in which the voltage-dependent fraction of the reverse current may be substantially suppressed. Examples thereof are trench MOS barrier junction diodes or trench MOS barrier Schottky (TMBS) diodes or trench junction barrier Schottky (TJBS) diodes. Some of these diodes are known in principle from published German patent application document DE 694 28 996 T2. It is proposed in a particularly advantageous embodiment of the present invention that Schottky diode S be replaced in a protective system according to the present invention with a Schottky diode which has a reverse-voltage-independent reverse current. In particular a TMBS or TJBS diode may be used as the Schottky diode. These Schottky diodes may also in particular be integrated together with the overvoltage protection Z diode into a semiconductor. Such a protective element may advantageously be operated at higher usage temperatures than a system as recited in claim 1, which contains normal Schottky diodes. If an increase of the temperature is not necessary, the forward voltage of such a system may alternatively also advantageously be selected to be still lower.

DETAILED DESCRIPTION OF THE INVENTION

Figure 1:
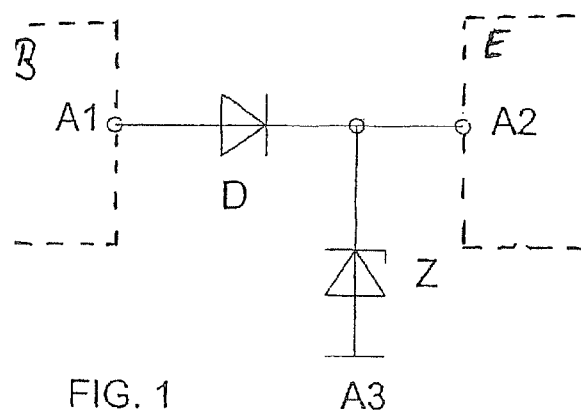
FIG. 1 shows a circuit diagram of a typical protective element having pn-diode D and Z diode or Zener diode Z.
Figure 2:
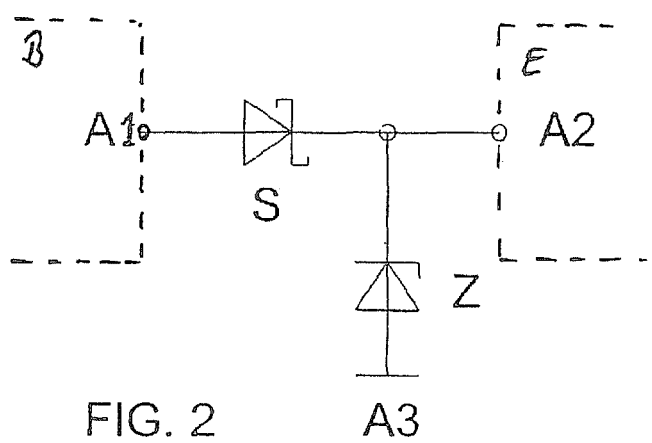
FIG. 2 shows a circuit diagram of a protective element according to the present invention having Schottky diode S and Z or Zener diode Z.

FIG. 2 shows a circuit diagram of a protective element or a protective system according to the present invention having Schottky diode S instead of pn-diode and Z or Zener diode Z. In this protective system, which may also be integrated into a semiconductor, a Schottky diode S is thus used as the polarity reversal protection diode and a Z diode Z is used for the overvoltage protection. The protective system is connected between the power supply, i.e., the battery or accumulator, and the electronics. Terminal Al is connected to the voltage supply and terminal A2 is connected to the electronics. A3 is connected to ground.

A Schottky diode or Schottky diodes may also be used, in the case of which the voltage-dependent fraction of the reverse current may be substantially suppressed. Examples thereof are TMBS diodes (trench MOS barrier junction diodes) or TJBS diodes (trench junction barrier Schottky diodes).

Furthermore, Schottky diodes S in a protective system according to the present invention may be replaced by a Schottky diode which has a reverse-voltage-independent reverse current. In particular a TMBS or TJBS diode may be used as the Schottky diode. These Schottky diodes may also in particular be integrated together with the overvoltage protection Z diode into a semiconductor. Such a protective element may be operated at higher usage temperatures than a system which contains normal Schottky diodes. If an elevation of the temperature is not necessary, the forward voltage of such a system may advantageously alternatively also be selected to be still lower.

Figure 3:
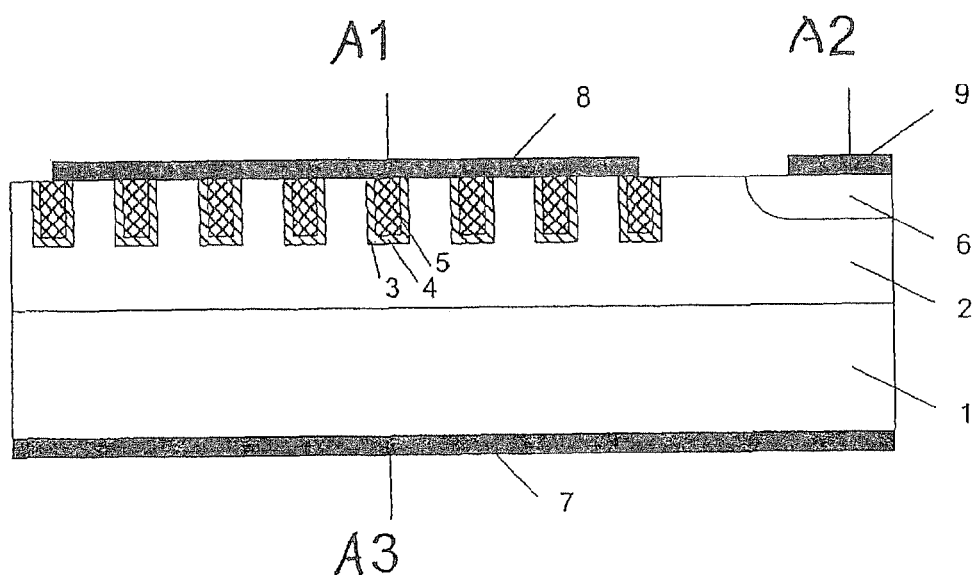
FIG. 3 shows a first system according to the present invention of a protective element having an integrated TMBS structure in cross section, the drawing not being to scale.

FIG. 3 schematically shows a first exemplary embodiment of an integrated system of the present invention in cross section. An n-doped silicon layer 2, into which at least two trenches 3 filled with thin oxide 4 and doped polysilicon 5 are introduced, is located on a p-doped silicon substrate 1. In addition, a heavily n-doped area 6 is located at at least one point. Areas 2 and 5 are provided with a metallization layer 8, areas 6 are provided with a metallization layer 9, and area 1 is provided with a metallization layer 7.

Metallization layer 8 forms, with n-doped layer 2 in the area between trenches 3, the actual Schottky contact and additionally, with doped polysilicon layer 5, an ohmic contact. It is used as terminal A1. The forward voltage of Schottky diode S may be established by suitable selection of the metal of metallization layer 8. Metallization layer 8 typically includes multiple layers; for example, a layer made of aluminum may be located over the actual Schottky metal. However, a simple metal layer is typically not used as the "Schottky metal" of metallization layer 8, but rather a suicide layer, i.e., a chemical compound of metal and silicon such as $TiSi_2$. Layers 9 and 7 form ohmic contacts with heavily n-doped or p-doped layers 6 and 1, respectively, and are used as terminals A2 and A3. They may also include a multilayer metal system according to the related art.

Geometry and doping concentrations are selected in accordance with the desired barrier properties of the protective element. Thus, for example, for a 20 V application, the thickness of n-doped layer 2 may be approximately 3 μm, the depth of heavily n-doped layer 6 may be 2 μm, the depth of trenches 3 may be 1 μm-2 μm, and the width and the distance between the trenches may be, for example, 0.5 μm. The doping concentrations of layers 1, 2, and 6 may be, for example, $1 \cdot 10^{19}$, $3 \cdot 10^{16}$, and $1 \cdot 10^{20}$ $cm^{-3}$. The width of the trenches may also be selected to be greater, without the advantageous reverse current behavior being influenced.

Additional boundary and passivation structures corresponding to the related art in semiconductor technology are not shown in the exemplary embodiments. The oxide layers or other dielectric layers which are typically provided on the chip surface are also omitted for reasons of clarity.

Figure 4:
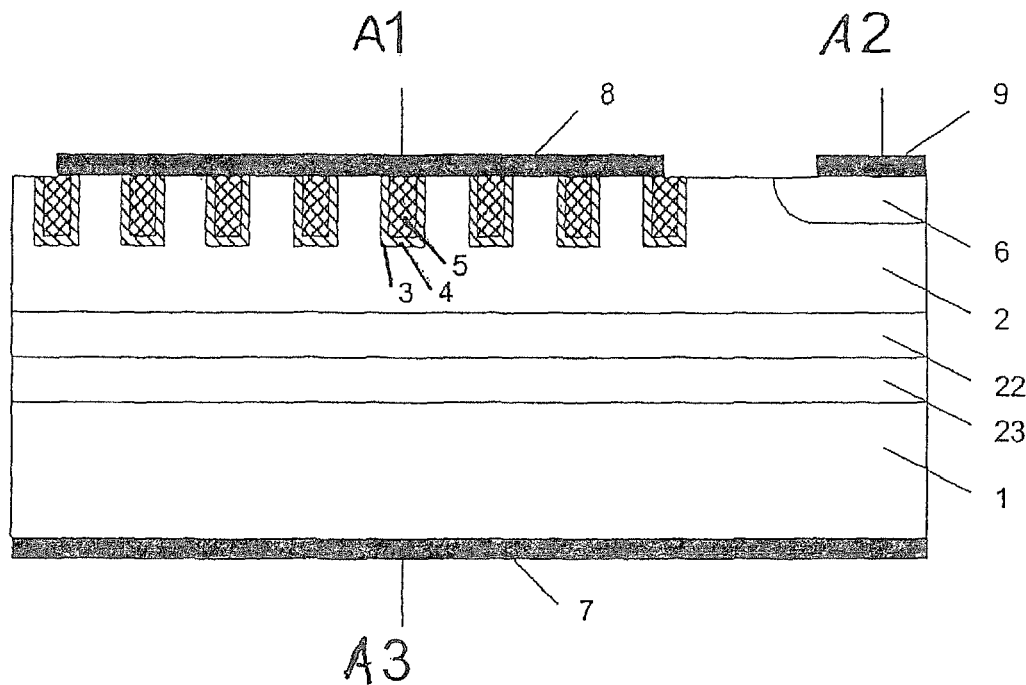
FIGS. 4 and 5 show a second system and a third system, respectively, of a protective element according to the present invention having an integrated TMBS structure in cross section, the drawings also not being to scale.

A further exemplary embodiment is shown in FIG. 4. In this case, the lower part of n-doped area 2 has a heavily n-doped buried layer 22 having a thickness of 5 μm and a doping concentration of approximately $1 \cdot 10^{19}$ $cm^{-3}$, for example. An approximately 2-μm-thick n-doped layer 23, which has the same doping concentration as layer 2, is located below buried layer 22. As a result of its high conductivity, buried layer 22 reduces the bulk resistance which occurs when current flows from Schottky contact 8-2 to heavily n-doped area 6. Since the breakdown voltage of the Z diode is determined by the doping concentration of p-layer 1 and the adjoining n-doped layer, a less heavily n-doped layer 23 must be provided between heavily n-doped layer 22 and layer 1. Of course, the thickness of buried heavily n-doped layer 22 may also have greater values. The bulk resistance may therefore advantageously be reduced still further.

In a novel manufacturing process according to the present invention, the thickness of the buried layer may even be increased to values of well over 200 μm. The bulk resistance may thus be reduced still further beyond the typical amount. In contrast to the typical manufacturing method, in which n-doped layer 2 is deposited as an epitaxial layer on a p-doped substrate 1, the manufacturing process of the novel manufacturing method according to the present invention begins with, for example, a 200-μm-thick heavily n-doped substrate wafer, which is used as buried layer 22. Subsequently, n-doped epitaxial layers 2 and 23 are applied to both sides of substrate 22. A further epitaxial layer, which has a heavy p-doping and is used as p-doped layer 1, is deposited over n-doped epitaxial layer 23. The introduction of trenches 3 and the further layers or structures is then performed in a typical way.

Alternatively, the further p-doped epitaxial layer for manufacturing p-doped layer 1 may be dispensed with. Instead, p-doping 1 may also be introduced with the aid of ion implantation or another typical method.

Figure 5:
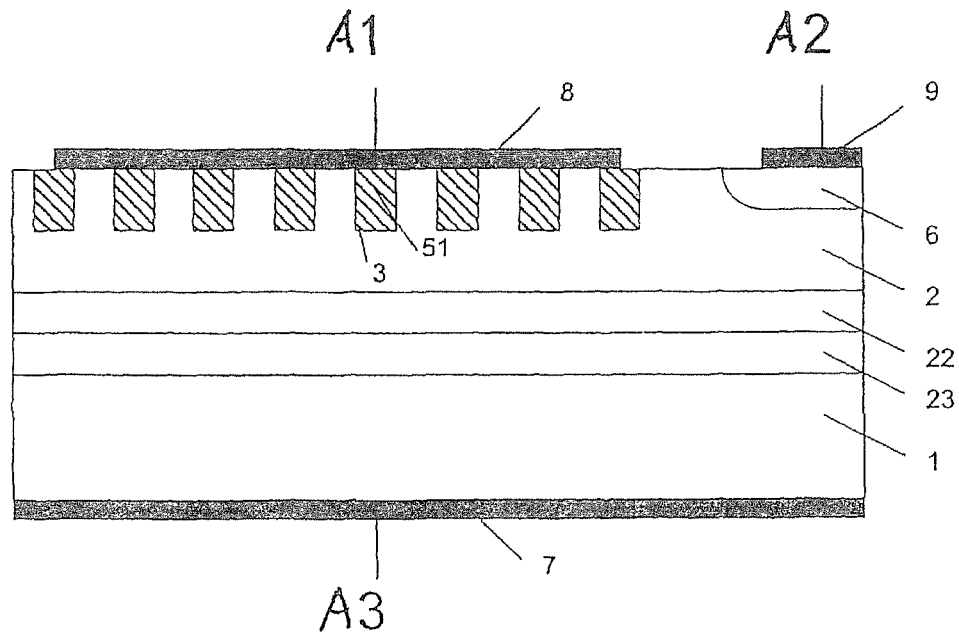

FIG. 5 shows an exemplary embodiment which, in contrast to the example according to FIG. 4, includes a TJBS diode instead of a TMBS diode. Reference numerals and structure correspond except for the area of trench 3. Instead of a thin oxide layer 4, a p-doped silicon layer 51 is located in the trenches. Instead of p-doped silicon layer 51, a heavily p-doped polysilicon layer may also be used. Further embodiments are conceivable, such as p-doped areas on the top side of the trenches and metal 8 or polysilicon in the trenches. Of course, buried layer 22 may also be omitted.

The integrated protective elements according to FIGS. 3 through 5 may be entirely or partially provided with a conductive metallization and may be soldered onto metal bodies, such as copper. Due to the high heat capacity, the heat may be transferred into this body in the event of brief interfering pulses and thus prevent an impermissibly high temperature increase in the semiconductor. In particular, metal layers 7 and 8 may be soldered or connected in another way to metal bodies.

What is claimed is:

1. A protective element for an electronics unit, comprising:
    at least one Schottky diode and at least one Zener diode located between a power supply and the electronics unit;
    wherein:
        the anode of the Schottky diode is connected to the power supply;
        the cathode of the Schottky diode and the cathode of the Zener diode are connected to the electronics unit;
        the anode of the Zener diode is connected to ground; and
        the Schottky diode is one of a trench MOS barrier Schottky diode or a trench junction barrier Schottky diode, and is developed in an integrated semiconductor system including a p-doped substrate, which is the anode of the Zener diode, and a buried n-doped layer.

2. The protective element as recited in claim 1, wherein the protective element includes at least one trench MOS barrier Schottky diode.

3. The protective element as recited in claim 2, wherein trenches are provided in the protective element.

4. The protective element as recited in claim 3, wherein the trenches are provided one of (i) in a strip arrangement, or (ii) as islands.

5. The protective element as recited in claim 3, further comprising:
    two metal layers, wherein the integrated semiconductor system is soldered in between the two metal layers.

6. The protective element as recited in claim 3, wherein the trenches are formed in an n-doped silicon layer.

7. The protective element as recited in claim 1, wherein the protective element has a trench junction barrier Schottky diode and a p-doped substrate, and wherein the p-doped substrate is the anode of the Zener diode.

8. The protective element as recited in claim 1, wherein the power supply supplies power to the electronics unit.

9. The protective element as recited in claim 1, wherein the Schottky diode has a reverse-voltage-independent reverse current.

10. The protective element as recited in claim 1, wherein the Schottky diode, Zener diode, and the electronics unit are integrated together into a single semiconductor integrated circuit.

11. The protective element as recited in claim 1, wherein the Schottky diode is a trench MOS barrier Schottky diode.

12. The protective element as recited in claim 1, wherein the Schottky diode is a trench junction barrier Schottky diode.

13. A method for manufacturing a protective element for an electronics unit, comprising:
- applying a first n-doped epitaxial layer on a first side of a heavily n-doped substrate wafer serving as a buried layer, and applying a second n-doped epitaxial layer on a second side of the heavily n-doped substrate wafer;
- depositing a p-doped epitaxial layer on the second n-doped epitaxial layer;
- forming trenches in the first n-doped epitaxial layer; and
- providing (i) a first metal layer on top of the first n-doped epitaxial layer, and (ii) a second metal layer on the p-doped epitaxial layer to form the protective element;
- wherein the protective element has at least one Zener diode and an integrated semiconductor system including at least one trench MOS barrier Schottky diode and the p-doped epitaxial layer, and wherein the p-doped epitaxial layer is the anode of the Zener diode.

14. The method as recited in claim 13, wherein the p-doped epitaxial layer is introduced with the aid of ion implantation.

* * * * *